US012243911B2

(12) United States Patent
Romig et al.

(10) Patent No.: US 12,243,911 B2
(45) Date of Patent: Mar. 4, 2025

(54) INTEGRATED CIRCUIT PACKAGE FOR ISOLATION DIES

(71) Applicant: Texas Instruments Incorporated, Dallas, TX (US)

(72) Inventors: Matthew David Romig, Allen, TX (US); Enis Tuncer, Dallas, TX (US); Rajen Manicon Murugan, Dallas, TX (US); Yiqi Tang, Allen, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 17/017,642

(22) Filed: Sep. 10, 2020

(65) Prior Publication Data

US 2021/0175326 A1   Jun. 10, 2021

Related U.S. Application Data

(60) Provisional application No. 62/945,679, filed on Dec. 9, 2019.

(51) Int. Cl.
*H01L 29/06* (2006.01)
*H01L 21/48* (2006.01)
*H01L 21/56* (2006.01)
*H01L 23/31* (2006.01)
*H01L 23/498* (2006.01)

(52) U.S. Cl.
CPC ...... *H01L 29/0642* (2013.01); *H01L 21/4825* (2013.01); *H01L 21/4839* (2013.01); *H01L 21/565* (2013.01); *H01L 23/3135* (2013.01); *H01L 23/49811* (2013.01)

(58) Field of Classification Search
CPC .......... H01L 23/3135; H01L 23/49811; H01L 23/3107; H01L 23/49541; H01L 23/49537; H01L 23/49575
See application file for complete search history.

(56) References Cited

U.S. PATENT DOCUMENTS

| 6,677,672 | B2 * | 1/2004 | Knapp | ................. H01L 23/3107 257/676 |
| 7,102,214 | B1 | 9/2006 | Miks et al. | |
| 7,298,037 | B2 | 11/2007 | Yim et al. | |
| 2011/0051378 | A1 * | 3/2011 | Wang | ...................... H01L 21/56 361/748 |

(Continued)

OTHER PUBLICATIONS

"ISO774x High-Spped, Robus-EMC Reinforced and Basic Quad-Channel Digital Isolators", SLLSEP4G, Texas Instruments, Inc., Mar. 2016, Revised Feb. 2020, pp. 1-49.

(Continued)

*Primary Examiner* — Evan G Clinton
(74) *Attorney, Agent, or Firm* — Ronald O. Neerings; Frank D. Cimino

(57) ABSTRACT

In described examples of an isolation device, an isolation die that has a set of bond pads is mounted on a first lead frame that has a set of leads. A portion of the bond pads are coupled to respective leads. A first mold material encapsulates the isolation device and the first lead frame forming a first package. The first package is mounted on a second lead frame that has a set of leads. A portion of the first lead frame leads is coupled to respective ones of the second lead frame leads. A second mold material encapsulates the first package and the second lead frame.

6 Claims, 8 Drawing Sheets

(56) References Cited

U.S. PATENT DOCUMENTS

2019/0206812 A1* 7/2019 Bonifield .............. B81B 7/0032

OTHER PUBLICATIONS

Enis Tuncer, Christopher Calabrese, and Weijun Yin, "Preliminary Numerical Study on Dielectric Mixtures Under Lightining Impulse Conditions", 2012 IEEE International Power Modulator and High Voltage Conference (IPMHVC), San Diego, CA, 2012, pp. 184-186.
"Hall-Effect Sensor Package with Added Current Path", TI-79890, U.S. Appl. No. 16/404,978, filed May 7, 2019, pp. 1-32.

* cited by examiner

INTEGRATED CIRCUIT PACKAGE FOR ISOLATION DIES

CROSS-REFERENCE TO RELATED APPLICATION

This application claims priority to U.S. Provisional patent Application No. 62/945,679 filed Dec. 9, 2019, the entirety of which is incorporated herein by reference.

TECHNICAL FIELD

This relates to a package for voltage isolation dies.

BACKGROUND

Galvanic isolation is a principle of isolating functional sections of electrical systems to prevent current flow from one section to another. To prevent current flow, no direct conduction path is permitted. Energy or information can still be exchanged between the sections by other means, such as capacitance, induction, or electromagnetic waves, or by optical, acoustic, or mechanical means.

Galvanic isolation may be used where two or more electric circuits must communicate, but their grounds may be at different potentials. It is an effective method of breaking ground loops by preventing unwanted current from flowing between two units sharing a ground conductor. Galvanic isolation is also used for safety, preventing accidental current from reaching ground through a person's body.

Integrated, capacitive-based, galvanic isolators allow information to be transmitted between nodes of a system at different voltage levels using a high voltage (HV) capacitive barrier along with a differential transmitter and receiver on either side of that barrier. The HV capacitors may be integrated as discrete capacitors or combined within the transmitter and receiver integrated circuits. In the latter case, each integrated circuit (IC) has an HV capacitor constructed in the IMD (inter-metal dielectric) layers that form the top layers of each IC. HV capacitors are typically implemented on each IC within a single package and connected by bond wires to create a composite capacitor formed from two series capacitor elements. This redundancy provides an increased level of safety, because if one cap fails there is still a second capacitor to provide isolation.

SUMMARY

In described examples of an isolation device, an isolation die that has a set of bond pads is mounted on a first lead frame that has a set of leads. A portion of the bond pads are coupled to respective leads. A first mold material encapsulates the isolation die and the first lead frame forming a first package. The first package is mounted on a second lead frame that has a set of leads. A portion of the first lead frame leads is coupled to respective ones of the second lead frame leads. A second mold material encapsulates the first package and the second lead frame.

DETAILED DESCRIPTION

Figure 1A:
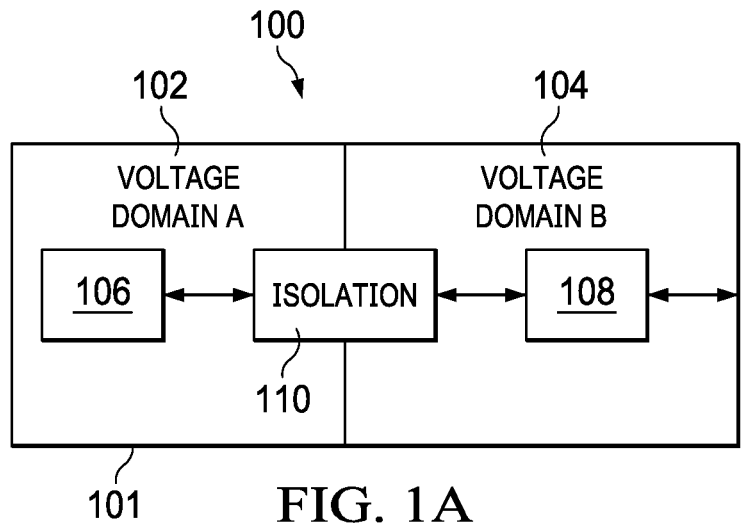
FIGS. 1A, 1B are block diagrams of a system having two voltage domains interfaced with a voltage isolation device.

In the drawings, like elements are denoted by like reference numerals for consistency.

Isolation packaging for high voltage devices requires large spacing between external leads to prevent leakage or arcing between nearby leads. Large lead spacing typically requires the use of large packages with imprecise manufacturing processes, coarse design rules, and non-robust materials. This may result in poor performance and quality of circuitry that is included within the large package. Isolation packaging limitations caused by a single set of materials, manufacturing processes, and design rules are overcome by a package-in-package structure and method using two sets of materials, manufacturing processes, and design rules.

As will be described in more detail hereinbelow, in an example isolation package the semiconductor die or dies that include circuitry are packaged in a leadless package with finer design rules, precise manufacturing processes, and robust materials. This leadless package is then attached to a lead frame that has larger lead spacing and encapsulated to form a large package. Different materials are used for each manufacturing process to achieve improved reliability and isolation performance.

FIG. 1A is a block diagram of a system 100 having two voltage domains 102, 104 interfaced with a voltage isolation device 110. In this example, system 100 includes a printed circuit board (PCB) that forms a substrate for the system. A basic PCB of a flat sheet of insulating material and a layer of copper foil, laminated to the substrate. Chemical etching divides the copper into separate conducting lines called tracks or circuit traces, pads for connections, vias to pass connections between layers of copper, and features such as solid conductive areas for electromagnetic shielding or other purposes. The tracks function as wires fixed in place and are insulated from each other by air and the board substrate material. The surface of a PCB may have a coating that protects the copper from corrosion and reduces the chances of solder shorts between traces or undesired electrical contact with stray bare wires. A printed circuit board can have multiple copper layers. A two-layer board has copper on both sides; multi-layer boards sandwich additional copper layers between layers of insulating material.

Box 106 represents circuitry that is mounted on substrate 101 and is operating in voltage domain A 102 using voltage and ground potentials provided by voltage domain A. Box 108 represents circuitry that is also mounted on substrate 101 and is operating in voltage domain B using voltage and ground potentials provided by voltage domain B 104. In this example, the voltage potential and ground potential provided in voltage domain A are isolated from the respective voltage potential and ground potential provided by voltage domain B. In another example, a system may have a common ground potential and separate voltage potentials if ground loops are not a concern.

Figure 1B:
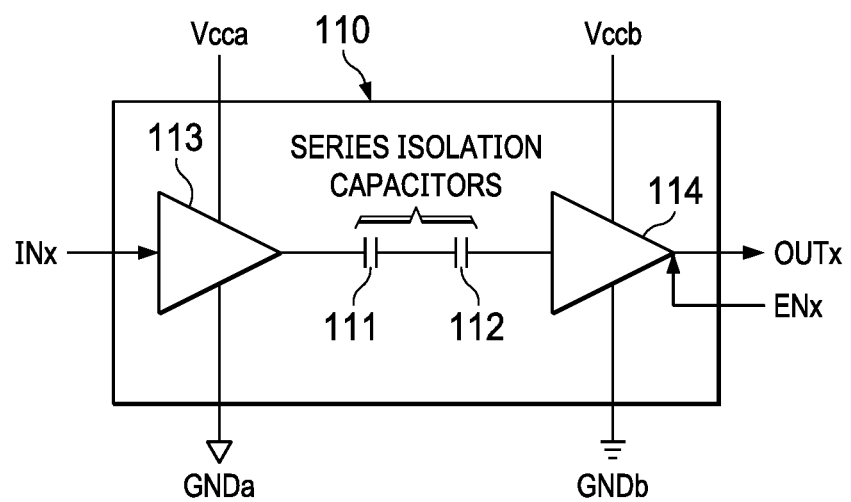

FIG. 1B is a more detailed block diagram of one channel of isolation device 110. In this example, isolation device 110 has four channels, but only one is illustrated for clarity. Each channel of isolation device 110 includes a composite capacitor that includes two serially connected capacitors 111, 112 to provide redundant voltage breakdown protection. In this example, buffer 113 receives a signal from circuitry 106 in voltage domain 102 and outputs it to propagate through blocking capacitors 111, 112. The propagated signal is received by buffer 114 and then provided to circuitry 108 in voltage domain 104. In this manner, galvanic isolation is provided between voltage domains 102, 104 while allowing signal information to be propagated between circuitry in the different voltage domains 102, 104.

The general concept of galvanic isolation devices using capacitors is well known. For example, see ISO774x devices available from Texas Instruments. The ISO774x devices are high-performance, quad-channel digital isolators with 5000 VRMS (DW package) and 3000 VRMS (DBQ package) isolation ratings per UL 1577. The ISO774x devices provide high electromagnetic immunity and low emissions at low power consumption, while isolating CMOS or LVCMOS digital I/Os. Each isolation channel has a logic input buffer and output buffer separated by a double capacitive silicon dioxide ($SiO_2$) insulation barrier. These devices come with enable pins which can be used to put the respective outputs in high impedance for multi-master driving applications and to reduce power consumption.

Figure 2:
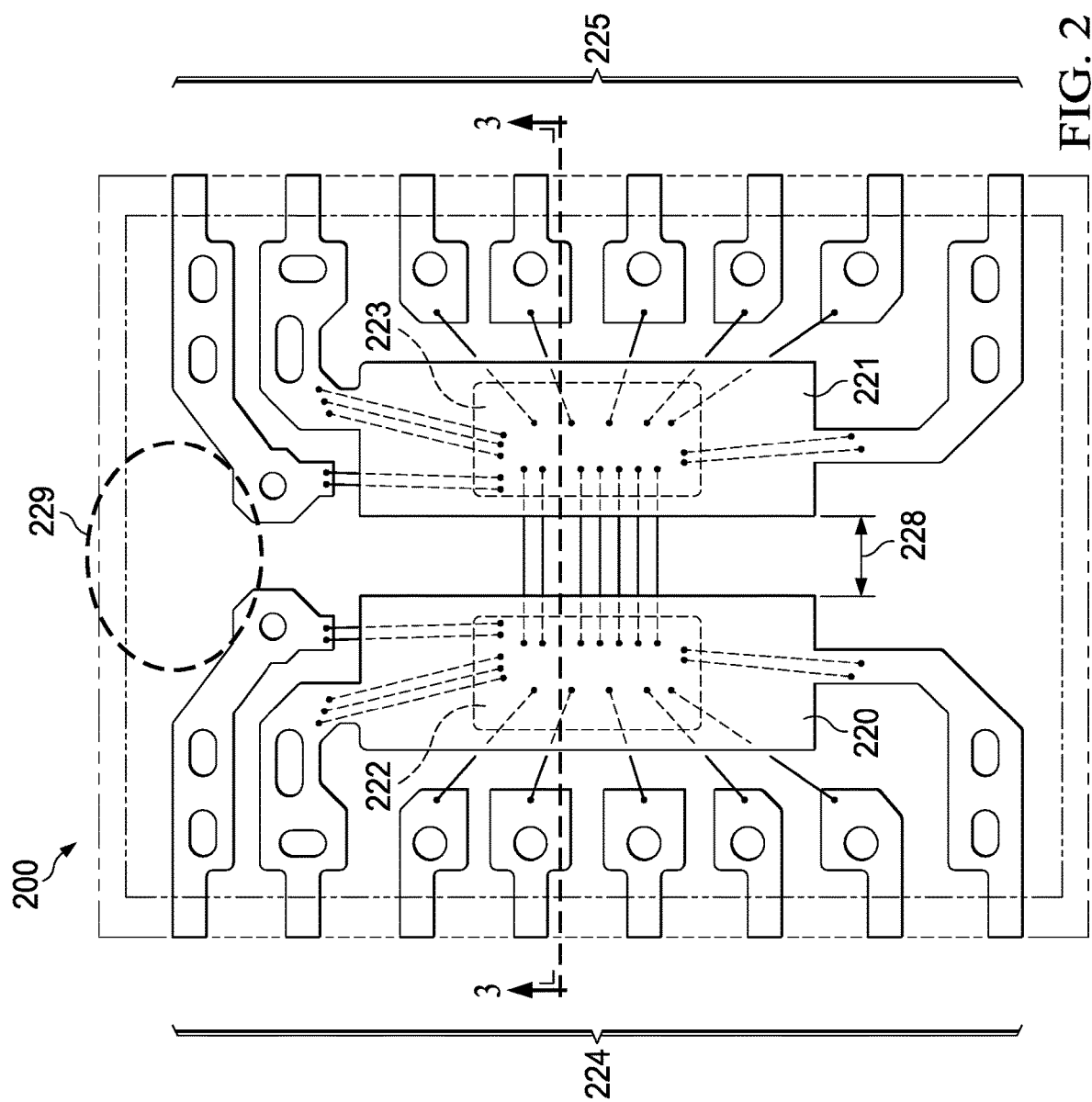
FIG. 2 is a top view of an example voltage isolation device.

FIG. 2 is a top view of example voltage isolation device 200. Integrated circuit (IC) die 222 contains one set of buffers and respective blocking capacitors, such as buffer 113 and capacitor 111 (FIG. 1B). IC die 223 contains another set of buffers and respective blocking capacitors, such as buffer 114 and capacitor 112 (FIG. 1B). A lead frame includes two die attach pads (DAP) 220, 221 on which respective dies 222, 223 are mounted. A set of leads indicated at 224 provides an interface with voltage domain 102 (FIG. 1A) while a second set of leads indicated at 225 provides an interface with voltage domain 104 (FIG. 1A). DAPs 220 and 221 are separated by a distance 228 to provide voltage isolation. The area at each end of isolation device 200, such as area 229 are kept free of lead frame metal to provide voltage isolation.

Example voltage isolation device 200 is encapsulated to form a dual flat no lead (DFN) package using known molding techniques. Using known molding techniques in a standard DFN package configuration may provide voltage isolation in the range of 3 kv to 5 kv, depending on package design and lead frame configuration. In another example, a quad flat no lead (QFN) package may be used.

Figure 3:
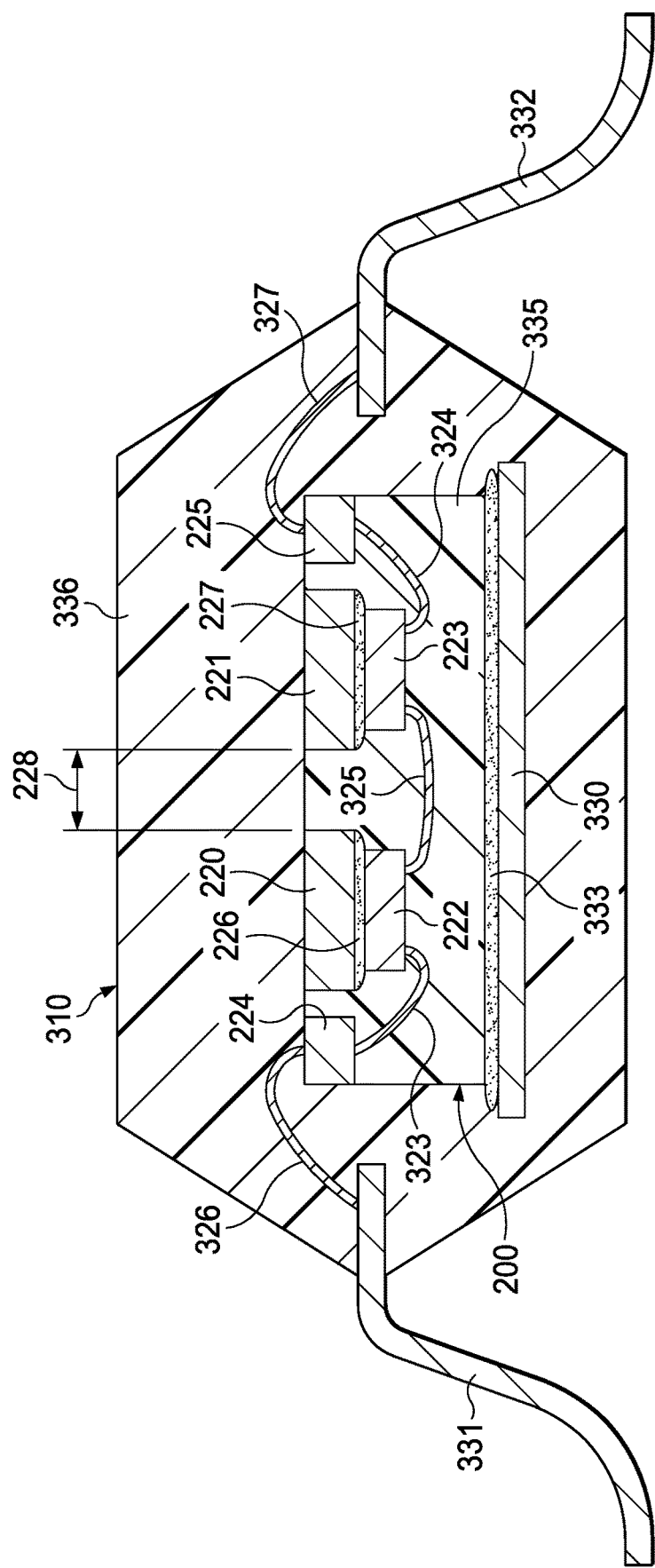
FIG. 3 is a cross sectional view of an example package-in-package voltage isolation device.

FIG. 3 is a cross sectional view of an example double encapsulated package-in-package voltage isolation device 310. In this example, the completed voltage isolation device 200 (FIG. 2) is mounted on a second lead frame that includes a DAP 330 using a die attach adhesive 333 in a dead bug configuration. The second lead frame also includes a set of leads indicated at 331 and another set of leads indicated at 332. Bond wires 326 couple leads 224 to respective leads 331, while bond wires 327 couple leads 225 to respective leads 332.

As described with regards to FIG. 2, voltage isolation device 200 has a lead frame that includes DAP 220 and DAP 221. Die 222 is mounted on DAP 220 using die attach adhesive 226. Die 223 is mounted on DAP 221 using die attach adhesive 227. Bond wires 323 couple bond pads on die 222 to respective leads 224. Bond wires 324 couple bond pads on die 223 to respective leads 225. Bond wires 325 couple bond pads on die 222 to bond pads on die 223 to serially couple the respective blocking capacitors on each die 222, 223.

In this example, isolation device 200 includes molding compound 335 that encapsulates the lead frame with DAP 221, 222 and die 222, 223 to form a DFN package that is referred to herein as "package I". Isolation device 310 includes molding compound 336 that further encapsulated isolation device 200 along with the second lead frame that includes DAP 330 and leads 331, 332 to form a small outline integrated circuit (SOIC) package that is referred to herein as "package II."

In this example, package I is mounted on DAP 330 in a dead bug manner and bond wires are used to interconnect respective leads. In another example, DAP 330 may be eliminated and leads 224, 225 on package I may be soldered directly to leads in package II.

Figure 4:
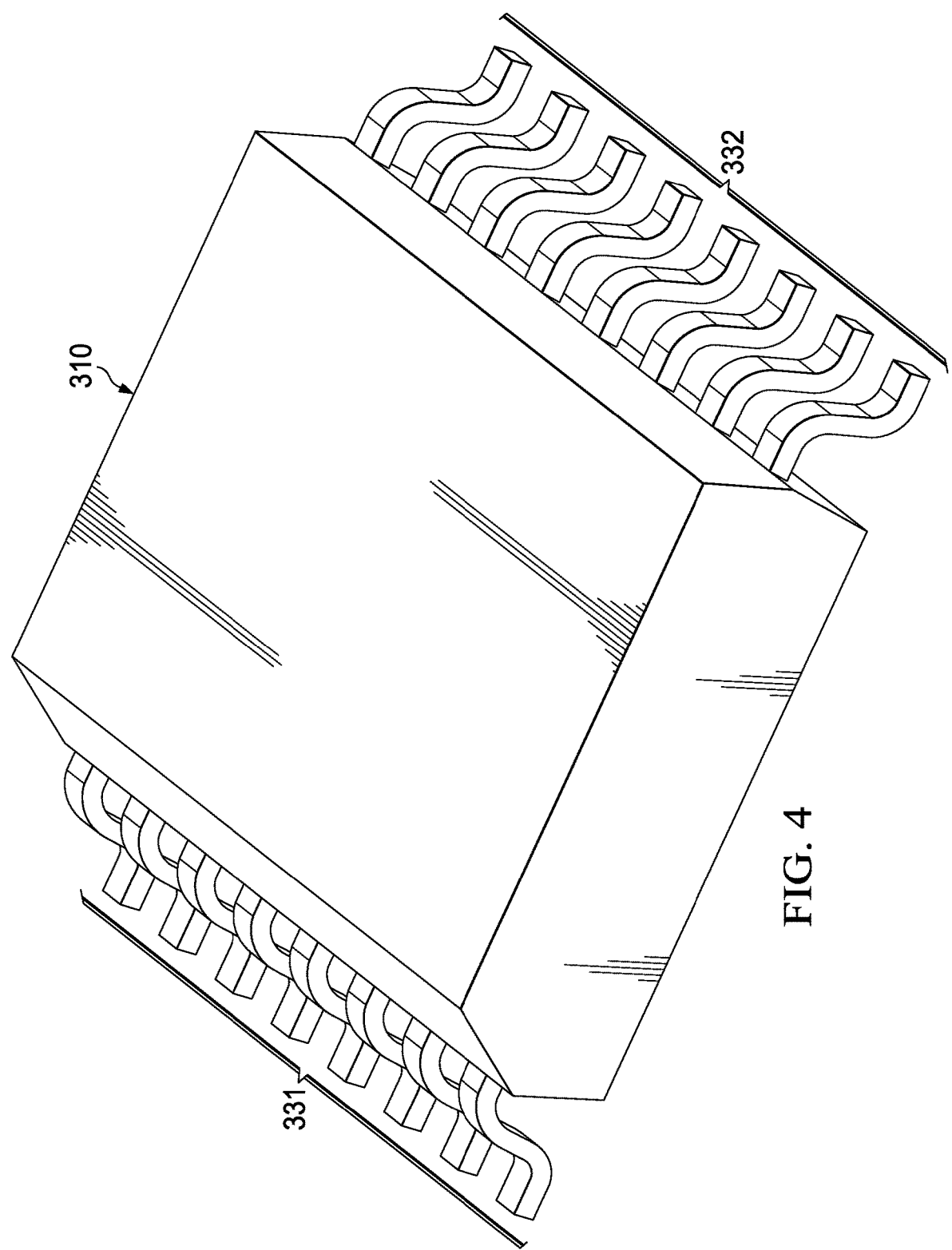
FIG. 4 is an isometric view of the example package-in-package voltage isolation device of FIG. 3.

FIG. 4 is an isometric view of the example double encapsulated 16 pin SOIC package-in-package voltage isolation device 310 of FIG. 3. In another example double encapsulated package-in-package voltage isolation device, a different known or later developed package configuration may be used, such as various types of surface mount package or through hole packages.

Figure 5:
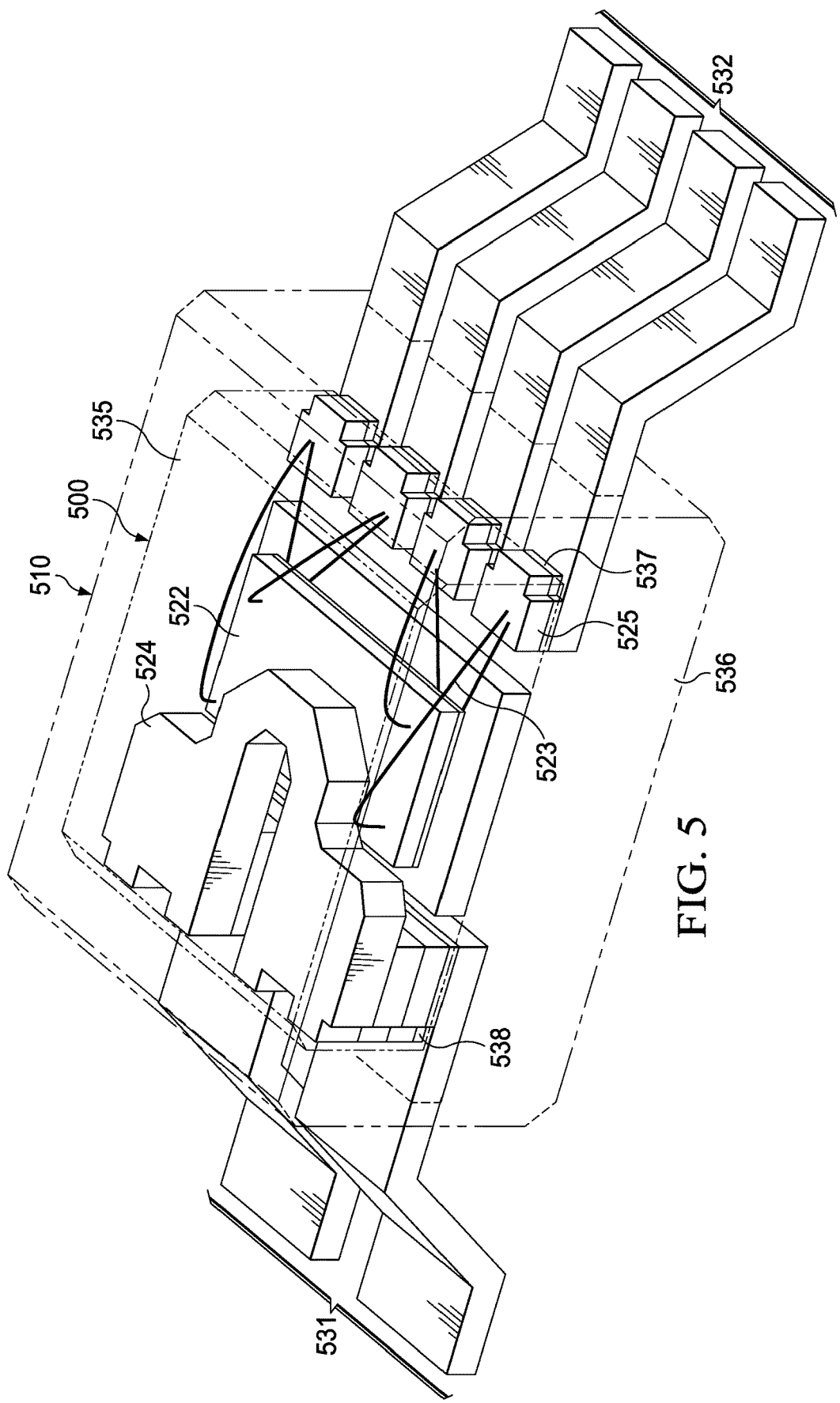
FIG. 5 is a transparent isometric view of another example package-in-package voltage isolation device.

FIG. 5 is a transparent isometric view of another example double encapsulated package-in-package voltage isolation device 510. In this example, package 500 includes a Hall effect device within IC 522 and a current lead 524 that is configured to impress an intrinsic magnetic field generated by current flowing through current lead 524 onto the Hall device within IC 522. Bond wires generally indicated at 523 couple bond pads on IC 522 to respective package 500 leads generally indicated at 525. Mold compound 535 encapsulates leads 524, 525 and IC 522 to form package 500 in a DFN configuration.

In this manner, current flowing in one voltage domain can be measured by circuitry in a second voltage domain while maintaining galvanic isolation between the voltage domains. An example Hall-effect device is described in more detail in U.S. patent application Ser. No. 16/404,978, entitled "Hall-Effect Sensor Package with Added Current Path," filed May 7, 2019, and is incorporated herein by reference.

In order to safely operate in systems that have voltage levels that exceed the voltage breakdown rating of package 500, package 500 is coupled to a second lead frame that includes leads 531, 532 using solder paste as indicated at 537, 538. A second mold compound 536 encapsulates leads 531, 532, and package 500 to form package 510. In this example, package 510 is configured as an eight pin SOIC. Package 500 is referred to herein as "package I" and package 510 is referred to herein as "package II."

Figure 6:
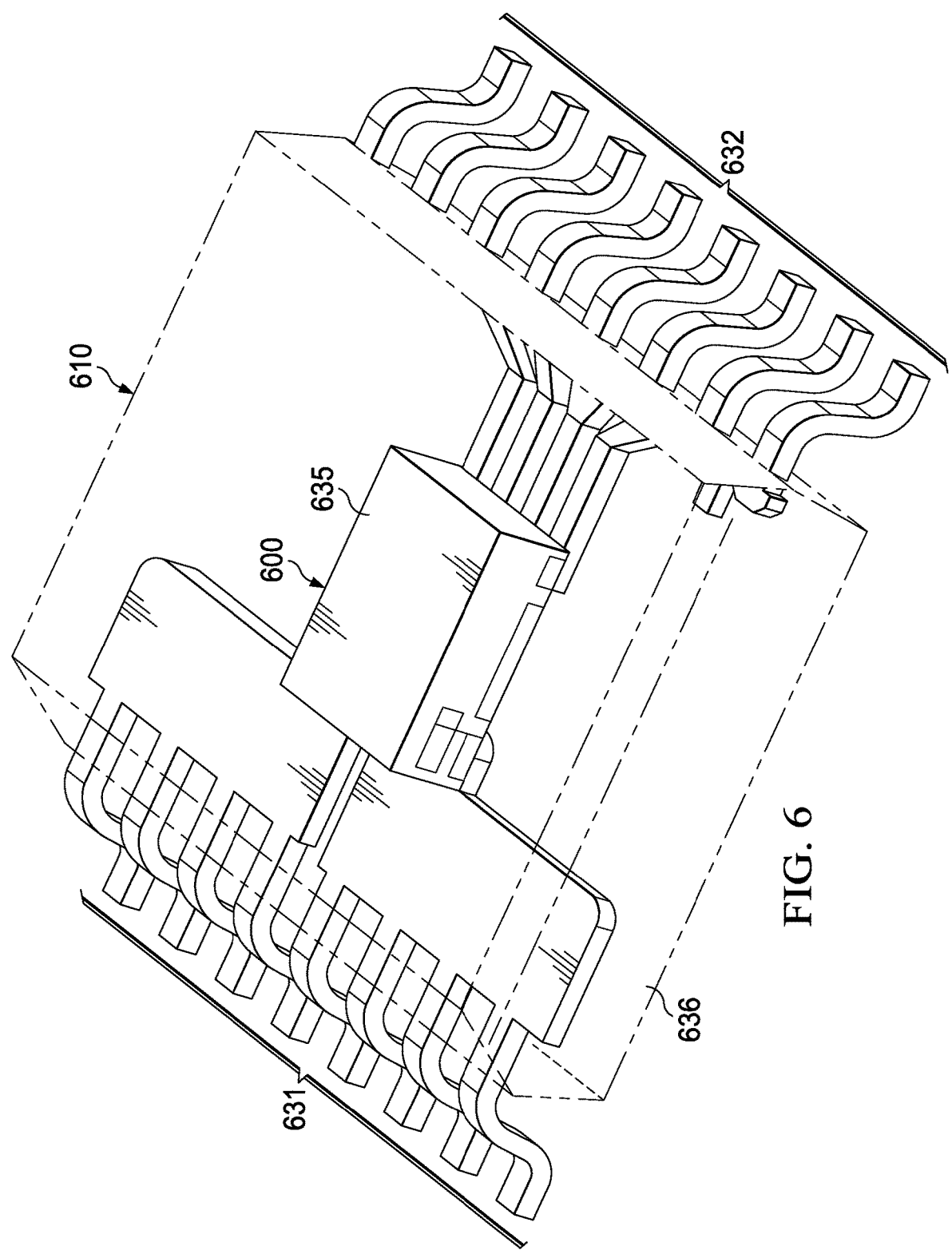
FIG. 6 is a transparent isometric view of another example package-in-package voltage isolation device.

FIG. 6 is a transparent isometric view of another example package-in-package voltage isolation device 610. In this example, package 600 is a DFN package that includes a Hall-effect device similar to package 500 in FIG. 5. Package 600 is encapsulated with mold compound 635 in a DFN configuration. Package 600 is soldered onto a second lead frame that includes leads 631, 632. A second mold compound 636 encapsulates leads 631, 632, and package 600 to form package 610. In this example, package 610 is configured as a sixteen pin SOIC. Package 600 is referred to herein as "package I" and package 610 is referred to herein as "package II."

Figure 7:
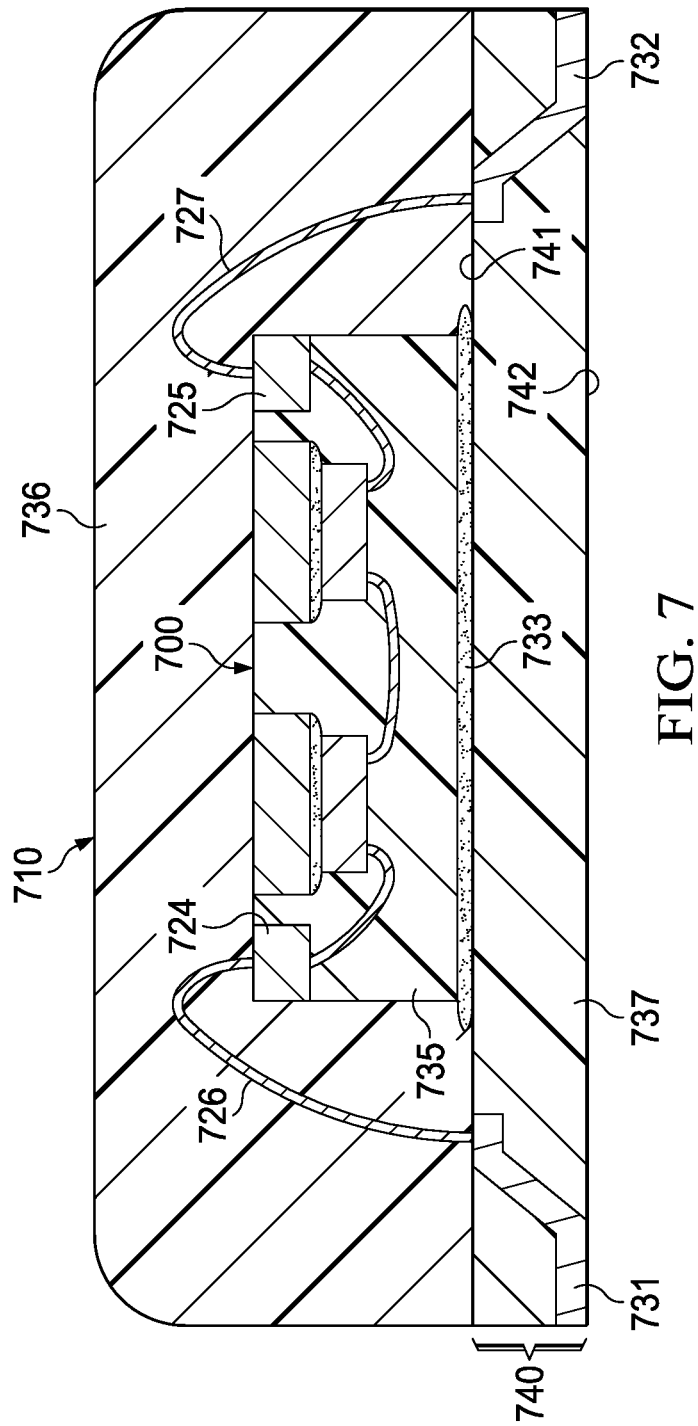
FIG. 7 is a cross sectional view of another example package-in-package voltage isolation device.

FIG. 7 is a cross sectional view of another example double encapsulated package-in-package voltage isolation device 710. In this example, package 700 is similar to package 300 of FIG. 3 and includes two die that are mounted to a lead frame with separate DAPS and encapsulated in a mold compound 735 to form package 700 in a DFN configuration.

In this example, a second lead frame 740 is a pre-molded lead frame that includes leads 731, 732. Mold compound 737 encapsulates leads 731, 732 and forms two parallel flat surfaces 741, 742. In this example, the leads 731, 732 are offset; in another example the leads/lead frame may be flat. Package 700 is mounted on flat surface 741 formed by mold compound 737 using die attach adhesive 733. Bond wires 726, 727 couple leads 724, 725 to respective leads 731, 732. Another mold compound 736 encapsulates the top surface 741 and package 700 to form package 710. In this example, package 710 is configured as a sixteen pin DFN package. Package 700 is referred to herein as "package I" and package 710 is referred to herein as "package II."

In this example, package 700 is mounted dead bug style on pre-molded lead frame 740. In another example, the pre-molded leads (such as leads 731, 732) may be positioned closer together and package I can be soldered or otherwise coupled directly to the leads on the pre-molded lead frame.

Figure 8:
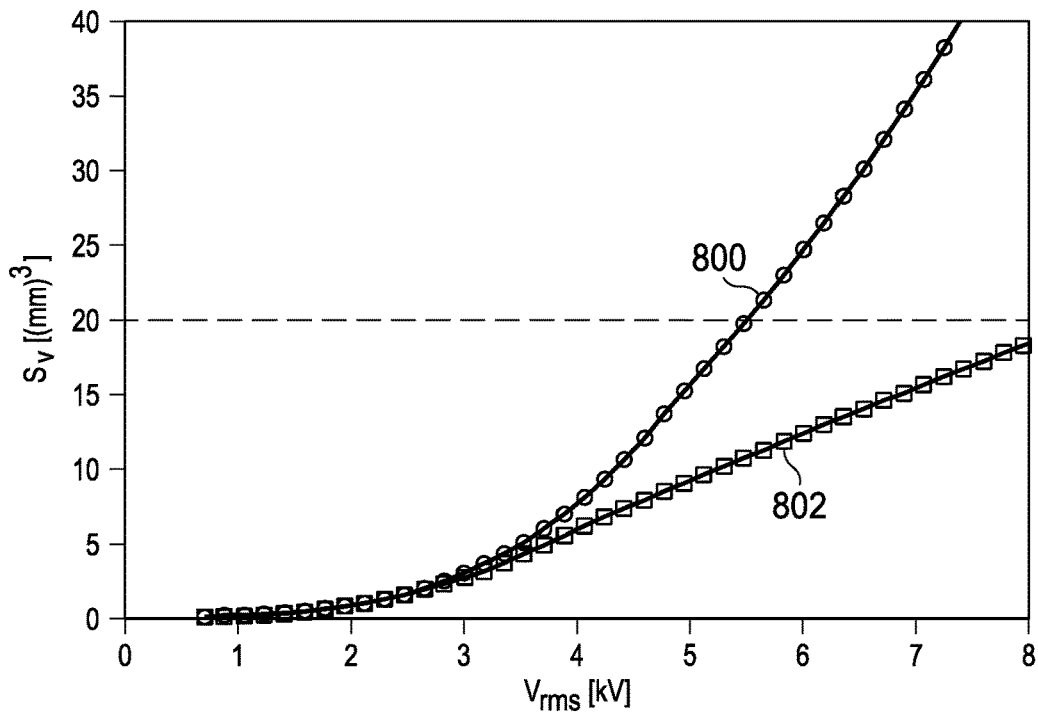
FIG. 8 is a plot illustrating stress volume vs. voltage for two different example voltage isolation devices.

FIG. 8 is a plot illustrating stress volume vs. voltage for two different example voltage isolation devices. This plot is derived from simulated operation of a device similar to isolation device 310 (see FIG. 3) mounted on a printed circuit board (PCB) substrate. In this example, stress volume ($S_v$) refers to a calculated volume of an electric field whose magnitude exceeds a selected threshold value. In this example, the plots represent the stress volume in air surrounding the isolation device package since that is the weakest dielectric medium in an example system, such as system 100 in FIG. 1. The concept of stress volume is described in more detail in "Preliminary Numerical Study on dielectric Mixtures Under Lightning Impulse Conditions," Enis Tuncer et al., 2012.

Plot line 800 represents the simulated performance of just package I mounted on a PCB, such as package 200 in FIG. 2, 3. Package 200 is a 16 pin DFN package. At an operating voltage of greater than approximately 5 kv the stress volume exceeds 20 mm$^3$. Plot line 802 represents the simulated performance of double encapsulated package-in-package isolation device mounted on a PCB, such as package 310 in FIG. 3. Package 310 is a 16 pin SOIC package. In this case, an operating voltage of greater than 8 kv does not exceed a stress volume threshold of 20 mm$^3$. In this example, observations of air breakdown observed in actual packages and simulations to match the measurement observations have determined that a voltage stress volume threshold of approximately 20 mm$^3$ with lead frame designs operating at 2V/um provide reliable operation.

Figure 9:
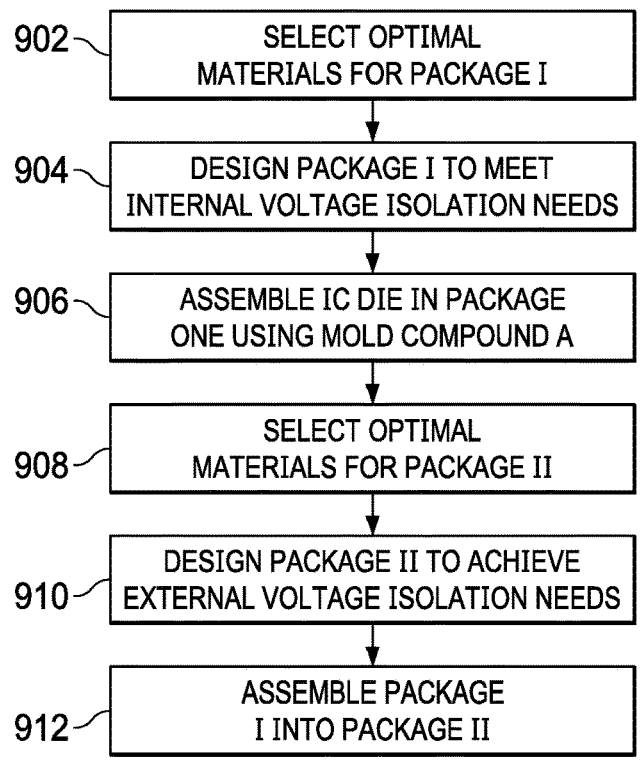
FIG. 9 is a flow diagram of fabrication of an example package-in-package voltage isolation device.

FIG. 9 is a flow diagram of fabrication of an example package in package voltage isolation device. High voltage isolation packages require large external lead spacing to avoid voltage breakdown between leads where they are attached to a PCB or other substrate. Large lead spacing requires package designs that generally have imprecise manufacturing processes, course design rules, and non-robust materials. This may result in poor electrical performance for sensitive electronic circuits. As described hereinabove, a package-in-package technique uses a second molding operation to over-mold a first package (package I) that has good circuit properties to produce a more robust final package (package II) that has good high voltage properties.

Different materials can be used for the fabrication of package I and package II to achieve improved reliability and isolation performance.

At 902, optimal materials are selected for package I considering various parameters, such as: charge spreading, mold voiding, delamination, etc.

At 904, package I is designed considering design rules needed to achieve a required internal voltage isolation rating. This may include items such as: DAP spacing, such as illustrated in by spacing 228 and clear space 229 in FIG. 2, or spacing between a current lead and a Hall-effect sensor in FIG. 5, etc. The bonding pads in DFN and QFN packages, for example, are typically NiPdAu which allows for a copper bond to the IC and produces high reliability interconnects that are suitable for automobile and other high reliability application. The additional copper area for DAPs in a DFN, QFN package can provide good thermal performance.

At 906, IC die(s) and lead frame are assembled and encapsulated using a first mold compound A to form package I.

At 908, optimal materials are selected for package II considering various parameters, such as external creepage/clearance to meet CTI rating (comparative tracking index), adhesion to mold compound A, thermal performance, etc.

At 910, package II is designed considering design rules needed to achieve a required external voltage isolation when mounted on a PCB or other substrate. For example, a SOIC package provides greater lead to lead spacing than a DFN or QFN package. The lead frame for a SOIC package is typically copper that is platted with nickel, palladium, or gold.

At 912, package I is mounted on a second lead frame using wire bonding, flip chip interconnection or other known or later developed techniques. Mold compound B is then used to encapsulate package I and the second lead frame and thereby form package II.

In this manner, higher isolation performance is provided using mold compound A having high dielectric properties. Lower cost is provided using better design rules from package I.

Better design rules, easier design customization, and more precise manufacturing process in Package I provides improved voltage isolation performance.

Using a standard or universal lead frame in Package II, rather than custom design, leads to manufacturing efficiency and lower cost. For example, a high volume stamped lead frame may be used. The lead frame for package I is plated with a first material and the lead frame for package II may be plated with a second material that is different from the first material.

Material sets chosen for each of the two packaging steps lead to higher isolation performance, yield, and quality. Both can contain mold compounds based on conventional semiconductor packaging materials composed of thermosets. In examples, package I can employ high temperature thermoplastics (such as polyetherimide and polyphenylsulfone and their derivatives) or silicone-based materials.

Isolation packaging limitations due to use of a single set of materials, manufacturing processes, and design rules is solved by a package-in-package structure and method using two sets of materials, manufacturing processes, and design rules.

Other Embodiments

In described examples, package I is a DFN or QFN package and package II is an SOIC package. In other examples, various known or later developed package types may be used for package I and package II, where package I is optimized for internal voltage isolation properties and package II is optimized for external voltage isolation properties pertaining to being mounted on a system substrate such as a PCB.

In described examples, the mold compounds used for package I and package II are different. However, in some cases the same type mold compound may be used for both packages.

In described examples, a system is mounted on a PCB substrate that is typically uses FR-4 glass epoxy as the insulating substrate. In other examples, various types of substrate material may be used that is suitable for high voltage operations, such as glass, ceramic, etc.

In described examples, package 1 leads are coupled to leads in package II using bond wires or solder paste. In other examples, known or later developed techniques may be used to couple package I leads to package II leads.

In this description, the term "couple" and derivatives thereof mean an indirect, direct, optical, and/or wireless electrical connection. Thus, if a first device couples to a second device, that connection may be through a direct electrical connection, through an indirect electrical connection via other devices and connections, through an optical electrical connection, and/or through a wireless electrical connection.

Modifications are possible in the described embodiments, and other embodiments are possible, within the scope of the claims.

What is claimed is:

1. An isolation device comprising:
an isolation die having bond pads;
a first lead frame having first leads, the isolation die being mounted on the first lead frame with a portion of the bond pads coupled to respective first leads;
first mold material encapsulating the isolation die and the first lead frame forming a first package;
a second lead frame having second leads, the first package being mounted on the second lead frame with a portion of the first leads coupled to respective second leads; and
second mold material encapsulating the first package and the second lead frame, wherein the second lead frame is a pre-molded lead frame, further comprising a third mold material encapsulating the second lead frame and forming a flat surface on which the first package is mounted.

2. An isolation device comprising:
an isolation die having bond pads;
a first lead frame having first leads, the isolation die being mounted on the first lead frame with a portion of the bond pads coupled to respective first leads, wherein the first lead frame is plated with a first material;
first mold material encapsulating the isolation die and the first lead frame forming a first package;
a second lead frame having second leads, the first package being mounted on the second lead frame with a portion of the first leads coupled to respective second leads, wherein the second lead frame is plated with a second material that is different from the first material; and
second mold material encapsulating the first package and the second lead frame.

3. A system comprising:
a substrate that includes a first voltage domain and a second voltage domain;
first circuitry mounted on the substrate in the first voltage domain, the first circuitry having a first signal terminal;
second circuitry mounted on the substrate in the second voltage domain, the second circuitry having a second signal terminal; and
an isolation device having an input terminal coupled to the first terminal and an output terminal coupled to the second terminal, wherein the isolation device comprises:
an isolation die having bond pads;
a first lead frame having first leads, the isolation die being mounted on the first lead frame with a portion of the bond pads coupled to respective first leads;
first mold material encapsulating the isolation die and the first lead frame forming a first package;
a second lead frame having second leads, the first package being mounted on the second lead frame with a portion of the first leads coupled to respective second leads; and
second mold material encapsulating the first package and the second lead frame, wherein the second lead frame is a pre-molded lead frame, further comprising a third mold material encapsulating the second lead frame and forming a flat surface on which the first package is mounted.

4. A system comprising:
a substrate that includes a first voltage domain and a second voltage domain;
first circuitry mounted on the substrate in the first voltage domain, the first circuitry having a first signal terminal;
second circuitry mounted on the substrate in the second voltage domain, the second circuitry having a second signal terminal; and
an isolation device having an input terminal coupled to the first terminal and an output terminal coupled to the second terminal, wherein the isolation device comprises:
an isolation die having bond pads;
a first lead frame having first leads, the isolation die being mounted on the first lead frame with a portion of the bond pads coupled to respective first leads, wherein the first lead frame is plated with a first material;
first mold material encapsulating the isolation die and the first lead frame forming a first package;
a second lead frame having second leads, the first package being mounted on the second lead frame with a portion of the first leads coupled to respective second leads, wherein the second lead frame is plated with a second material that is different from the first material; and
second mold material encapsulating the first package and the second lead frame.

5. A method for fabricating an isolation device, the method comprising:
fabricating an isolation die having bond pads;
mounting the isolation die on a first lead frame having first leads;
coupling a portion of the bond pads to respective first leads;
encapsulating the isolation die and the first lead frame with a first mold material to form a first package;
pre-molding a second lead frame having second leads with a second mold material to form a flat surface on which the first package is to be mounted;
mounting the first package on a second lead frame;
coupling a portion of the first leads to respective ones of the second leads; and encapsulating the first package and the second lead frame with a second mold material.

6. A method for fabricating an isolation device, the method comprising:

fabricating an isolation die having bond pads;

mounting the isolation die on a first lead frame having first leads;

coupling a portion of the bond pads to respective first leads;

encapsulating the isolation die and the first lead frame with a first mold material to form a first package;

mounting the first package on a second lead frame having second leads;

coupling a portion of the first leads to respective second leads; and encapsulating the first package and the second lead frame with a second mold material, further comprising plating the first lead frame with a first material and plating the second lead frame with a second material that is different from the first material.

* * * * *